United States Patent
Su et al.

(10) Patent No.: US 8,080,466 B2
(45) Date of Patent: Dec. 20, 2011

(54) METHOD FOR GROWTH OF NITROGEN FACE (N-FACE) POLARITY COMPOUND NITRIDE SEMICONDUCTOR DEVICE WITH INTEGRATED PROCESSING SYSTEM

(75) Inventors: Jie Su, Santa Clara, CA (US); Olga Kryliouk, Sunnyvale, CA (US); Yuriy Melnik, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/853,409

(22) Filed: Aug. 10, 2010

(65) Prior Publication Data

US 2011/0033966 A1    Feb. 10, 2011

Related U.S. Application Data

(60) Provisional application No. 61/232,623, filed on Aug. 10, 2009.

(51) Int. Cl.
*H01L 21/36* (2006.01)
(52) U.S. Cl. ........ 438/478; 438/680; 438/698; 438/778; 438/E21.09
(58) Field of Classification Search ............ 438/22, 438/48, 478, 778, 680, 698
See application file for complete search history.

(56) References Cited

U.S. PATENT DOCUMENTS

| | | | |
|---|---|---|---|
| 2007/0240631 | A1 | 10/2007 | Nijhawan et al. |
| 2009/0079034 | A1* | 3/2009 | Wang ............... 257/615 |
| 2009/0085065 | A1 | 4/2009 | Mishra et al. |
| 2009/0194026 | A1 | 8/2009 | Burrows et al. |
| 2010/0261340 | A1* | 10/2010 | Nijhawan et al. ...... 438/478 |
| 2011/0027973 | A1* | 2/2011 | Su et al. ............... 438/478 |
| 2011/0042682 | A1* | 2/2011 | Preble et al. .......... 257/76 |

* cited by examiner

*Primary Examiner* — Dung A. Le
(74) *Attorney, Agent, or Firm* — Patterson & Sheridan, L.L.P.

(57) ABSTRACT

Embodiments described herein generally relate to apparatus and methods for forming Group III-V materials by metal-organic chemical vapor deposition (MOCVD) processes and hydride vapor phase epitaxial (HVPE) processes. In one embodiment, a method for fabricating a nitrogen-face (N-face) polarity compound nitride semiconductor device is provided. The method comprises depositing a nitrogen containing buffer layer having N-face polarity over one or more substrates using a metal organic chemical vapor deposition (MOCVD) process to form one or more substrates having N-face polarity and depositing a gallium nitride (GaN) layer over the nitrogen containing buffer layer using a hydride vapor phase epitaxial (HVPE) deposition process, wherein the nitrogen containing buffer layer and the GaN layer are formed without breaking vacuum and exposing the one or more substrates to atmosphere.

16 Claims, 10 Drawing Sheets

(b) N-face LED (b) INTEGRATED GaN LAYER GROWTH (a) BUFFER LAYER GROWTH

METHOD FOR GROWTH OF NITROGEN FACE (N-FACE) POLARITY COMPOUND NITRIDE SEMICONDUCTOR DEVICE WITH INTEGRATED PROCESSING SYSTEM

CROSS-REFERENCE TO RELATED APPLICATIONS

This application claims benefit of U.S. provisional patent application Ser. No. 61/232,623, filed Aug. 10, 2009, which is herein incorporated by reference in its entirety.

BACKGROUND OF THE INVENTION

1. Field of the Invention

Embodiments of the present invention generally relate to apparatus and methods for the manufacturing of devices, such as light emitting diodes (LEDs) or laser diodes, and, more particularly, to apparatus and methods for forming Group III-V materials by metal-organic chemical vapor deposition (MOCVD) and hydride vapor phase epitaxial (HVPE) deposition processes.

2. Description of the Related Art

Group III-V films are finding greater importance in the development and fabrication of a variety of semiconductor devices, such as short wavelength LEDs, LDs, and electronic devices including high power, high frequency, high temperature transistors and integrated circuits. For example, short wavelength (e.g., blue/green to ultraviolet) LEDs are fabricated using the Group III-nitride semiconducting material gallium nitride (GaN). It has been observed that short wavelength LEDs fabricated using GaN can provide significantly greater efficiencies and longer operating lifetimes than short wavelength LEDs fabricated using non-nitride semiconducting materials, comprising Group II-VI elements.

One method that has been used for depositing Group III-nitrides is metal organic chemical vapor deposition (MOCVD). This chemical vapor deposition method is generally performed in a reactor having a temperature controlled environment to assure the stability of a first precursor gas which contains at least one element from Group III, such as gallium (Ga). A second precursor gas, such as ammonia ($NH_3$), provides the nitrogen needed to form a Group III-nitride. The two precursor gases are injected into a processing zone within the reactor where they mix and move towards a heated substrate in the processing zone. A carrier gas may be used to assist in the transport of the precursor gases towards the substrate. The precursors react at the surface of the heated substrate to form a Group III-nitride layer, such as GaN, on the substrate surface.

Another method that has been used to deposit Group III-nitrides, such as GaN, is hydride vapor phase epitaxy (HVPE) deposition. In HVPE, a halide reacts with a Group-III metal to form a metal containing precursor (e.g., metal chloride). The metal containing precursor then reacts with a nitrogen containing gas to form the Group-III metal nitride.

As the demand for LEDs, LDs, transistors, and integrated circuits increases, the efficiency of depositing high quality Group-III nitride films takes on greater importance. Therefore, there is a need for improved methods and apparatus that can provide high-throughput while maintaining consistent film quality over larger substrates and larger deposition areas.

SUMMARY OF THE INVENTION

Embodiments described herein generally relate to apparatus and methods for forming Group III-V materials by metal-organic chemical vapor deposition (MOCVD) processes and hydride vapor phase epitaxial (HVPE) processes. In one embodiment, a method for fabricating a nitrogen-face (N-face) polarity compound nitride semiconductor device is provided. The method comprises depositing a nitrogen containing buffer layer having N-face polarity over one or more substrates using a metal organic chemical vapor deposition (MOCVD) process to form one or more substrates having N-face polarity and depositing a gallium nitride (GaN) layer over the nitrogen containing buffer layer using a hydride vapor phase epitaxial (HVPE) deposition process, wherein the nitrogen containing buffer layer and the GaN layer are formed without breaking vacuum and exposing the one or more substrates to atmosphere.

In another embodiment, a method for fabricating a nitrogen-face (N-face) polarity compound nitride semiconductor device is provided. The method comprises positioning one or more substrates that provide for N-Face growth into a hydride vapor phase epitaxy (HVPE) chamber, depositing a first layer comprising nitrogen and a first group-III element over the one or more substrates that provide for N-face growth, transferring the one or more substrates into a first metal organic chemical vapor deposition (MOCVD) chamber without breaking vacuum, depositing a second layer comprising nitrogen and a second group-III element different from the first group-III element over the first layer, transferring the one or more substrates into a second MOCVD chamber without breaking vacuum, and depositing a third layer comprising nitrogen and a third group-III element different from the first group-III element and the second group-III element over the second layer in the second MOCVD chamber.

In yet another embodiment an integrated processing system for fabricating a nitrogen-face (N-face) polarity compound nitride semiconductor device is provided. The integrated processing system comprises a transfer chamber, a robot assembly disposed in the transfer chamber, one or more metalorganic chemical vapor deposition (MOCVD) chambers operable to form a nitrogen containing buffer layer over the one or more substrates in transferable communication with the transfer chamber, and one or more hydride vapor phase epitaxy (HVPE) chambers operable to form a group III-nitrogen containing layer over the nitrogen containing buffer layer in transferable communication with the transfer region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments described herein generally relate to apparatus and methods for forming Group III-V materials by metal-organic chemical vapor deposition (MOCVD) processes and/or hydride vapor phase epitaxial (HVPE) processes.

Figure 5:
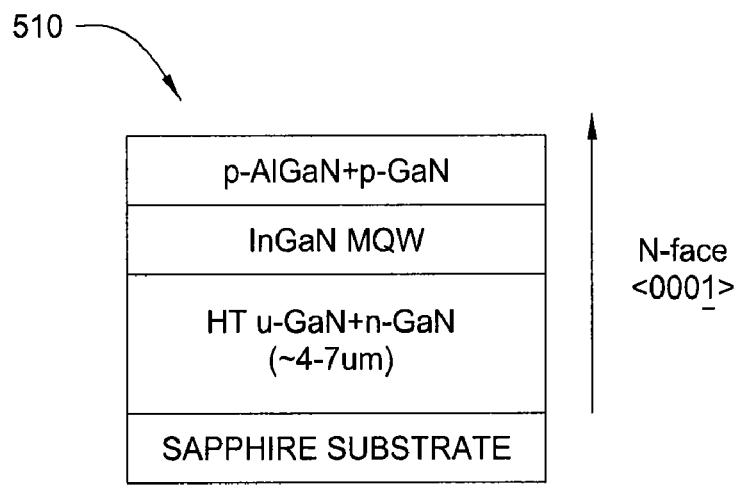
FIG. 5 is a schematic illustration of one embodiment of a structure of a nitrogen-Face (N-face) LED.

Typically, a GaN-based LED is grown on <0001> c-plane sapphire, resulting in growth along the <0001> direction, or so called gallium-face (Ga-face or Ga-polarity). The modification of the band edges due to the polarization and piezoelectric fields inside the GaN layer have a significant effect on the optical properties. With the Stark and Franz-Keldysh effects, the photoluminescence will be red-shifted and the recombination probability of electron hole pairs will decrease because of the spatial separation of electrons and holes. By growing the LED along the <0001> direction or the N-face direction, as shown on substrate 510 in FIG. 5, the effect of the piezoelectric field and polarization could be minimized.

Certain embodiments described herein relate to the growth of N-face LED with an integrated processing system, such as a cluster tool or an in-line tool, which includes HVPE and MOCVD chambers. N-face growth can be obtained by using a substrate that naturally provides for N-Face growth, or by using surface treatments on substrates, such as sapphire, or silicon carbide (SiC) to generate a buffer that leads to growth along the <0001> direction. The N-face GaN can be grown on the substrate that naturally provides for N-Face growth and the subsequent active layers and p-type contact layer may be deposited in the same HVPE chamber or one of the MOCVD chambers.

Certain embodiments described herein also relate to the in-situ growth of N-face GaN by HVPE. The growth of N-polarity can be obtained using a substrate that naturally provides for the N-face, or by using surface treatments on substrates, such as sapphire, or SiC to generate the buffer that leads to growth along <0001> direction. After the growth of N-face GaN and an optional Si-GaN layer, the subsequent MQW, p-AlGaN and p-GaN layers may be grown in the same HVPE chamber or in another MOCVD chamber.

Figure 1:
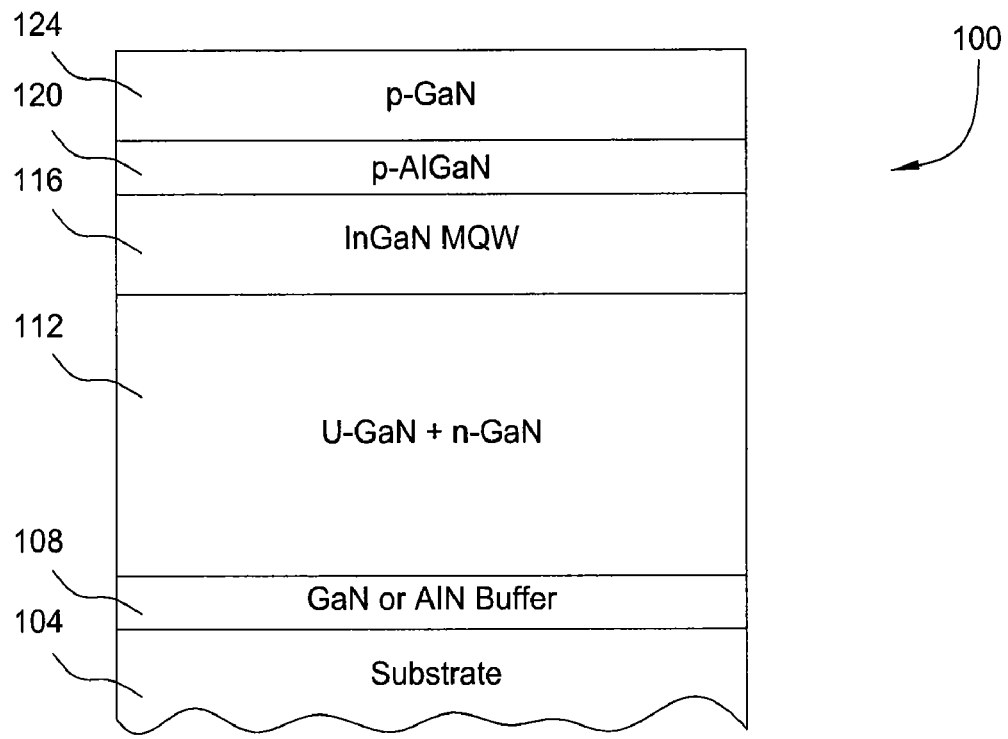
FIG. 1 is a schematic illustration of one embodiment of a structure of a GaN-based LED.

One nitride-based structure is illustrated in FIG. 1 as a GaN-based LED structure 100. It is fabricated over a substrate 104. In one embodiment, the substrate 104 is a sapphire substrate. In one embodiment, the substrate provides for N-Face growth. N-Face growth can be obtained by using a substrate that naturally provides for N-Face growth, such as silicon carbide (SiC), or by using surface treatments on substrates, such as sapphire, to generate a buffer that leads to growth along the N-Face <0001> direction. In one embodiment, an undoped gallium nitride (u-GaN) layer followed by an n-type doped gallium nitride (n-GaN layer) 112 is deposited over a GaN or aluminum nitride (AlN) buffer layer 108 formed over the substrate. An active region of the device is embodied in a multi-quantum-well layer 116, shown in the drawing to comprise an InGaN layer. A p-n junction is formed with an overlying p-type AlGaN layer 120, with a p-GaN contact layer 124 acting as a contact layer.

Figure 2:
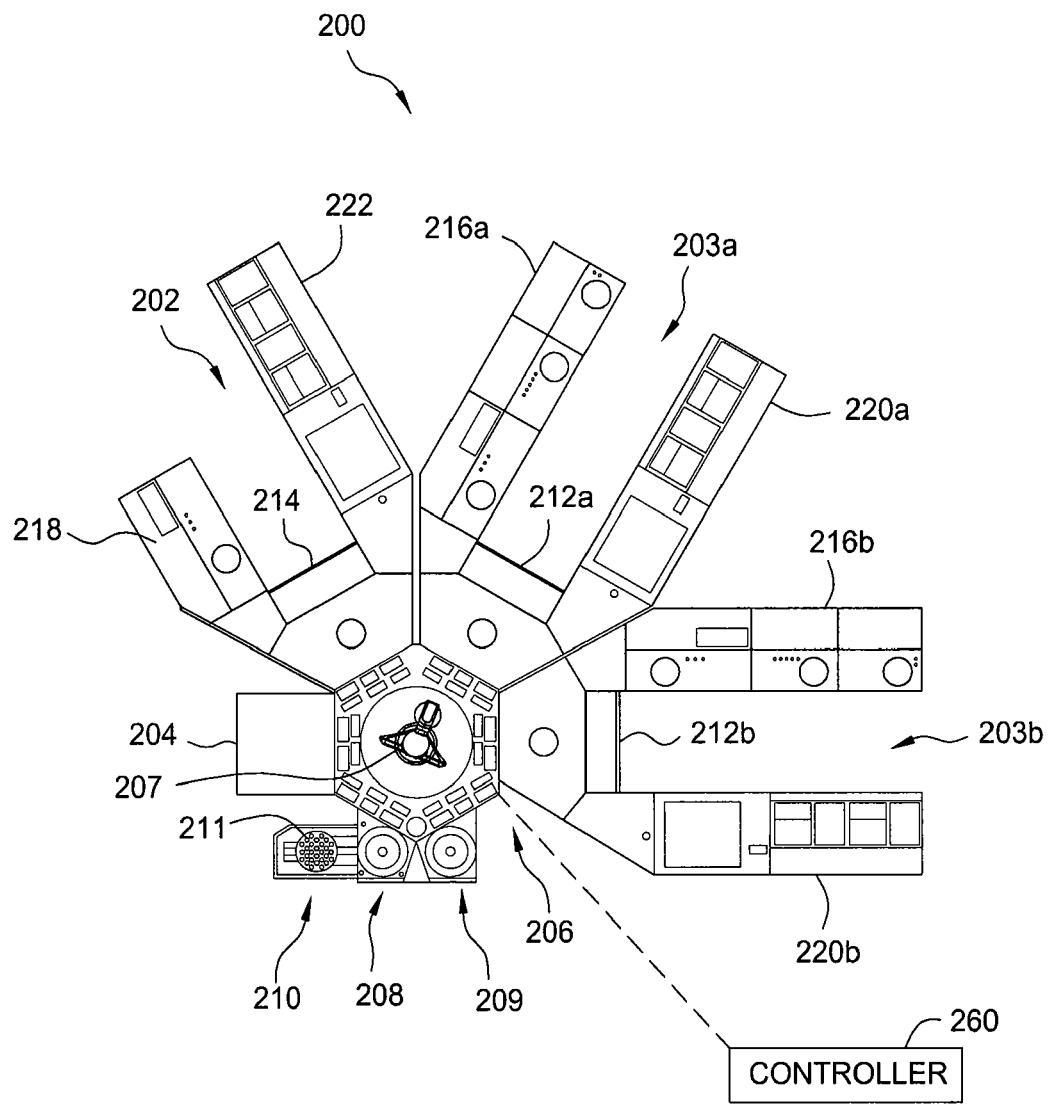
FIG. 2 is a schematic top view illustrating one embodiment of a processing system for fabricating compound nitride semiconductor devices according to embodiments described herein.

FIG. 2 is a schematic top view illustrating one embodiment of a processing system 200 comprising one HVPE chamber 202 and multiple MOCVD chamber 203a and 203b for fabricating compound nitride semiconductor devices according to embodiments described herein. In one embodiment, the environment within the processing system 200 is maintained as a vacuum environment or at a pressure below atmospheric pressure. In certain embodiments it may be desirable to backfill the processing system 200 with an inert gas such as nitrogen. Although one HVPE chamber 202 and two MOCVD chambers 203a and 203b are shown, it should be understood that any combination of one or more MOCVD chambers with one or more HVPE chambers may also be coupled with the transfer chamber 206.

In one embodiment, an additional chamber 204 is coupled with the transfer chamber 206. In one embodiment, the additional chamber 204 comprises an additional processing chamber such as an MOCVD chamber or an HVPE chamber. In another embodiment, the additional chamber 204 may comprise a metrology chamber. In yet another embodiment, the additional chamber 204 may contain pre-processing or post-processing chambers, such as service chambers that are adapted for degassing, orientation, cool down, pretreatment/preclean, post-anneal and the like. In one embodiment, the transfer chamber is six-sided and hexagonal in shape with six positions for process chamber mounting. In another embodiment, the transfer chamber 206 may have other shapes and have five, seven, eight, or more sides with a corresponding number of process chamber mounting positions.

The HVPE chamber 202 is adapted to perform HVPE processes in which gaseous metal halides are used to epitaxially grow thick layers of compound nitride semiconductor materials on heated substrates. The HVPE chamber 202 comprises a chamber body 214 where a substrate is placed to undergo processing, a chemical delivery module 218 from which gas precursors are delivered to the chamber body 214, and an electrical module 222 that includes the electrical system for the HVPE chamber of the processing system 200.

Each MOCVD chamber 203a, 203b comprises a chamber body 212a, 212b forming a processing region where a substrate is placed to undergo processing, a chemical delivery module 216a, 216b from which gas precursors are delivered to the chamber body 212a, 212b and an electrical module 220a, 220b for each MOCVD chamber 203a, 203b that includes the electrical system for each MOCVD chamber of the processing system 200. Each MOCVD chamber 203a, 203b is adapted to perform CVD processes in which metalorganic elements react with metal hydride elements to form thin layers of compound nitride semiconductor materials.

The processing system 200 comprises a transfer chamber 206 housing a substrate handler (not shown), an HVPE chamber 202, a first MOCVD chamber 203a, and a second MOCVD chamber 203b coupled with the transfer chamber 206, a loadlock chamber 208 coupled with the transfer chamber 206, a batch loadlock chamber 209, for storing substrates, coupled with the transfer chamber 206, and a load station 210, for loading substrates, coupled with the loadlock chamber 208. The transfer chamber 206 comprises a robot assembly 207 operable to pick up and transfer substrates between the loadlock chamber 208, the batch loadlock chamber 209, the HVPE chamber 202, the first MOCVD chamber 203a, and the second MOCVD chamber 203b.

The transfer chamber 206 may remain under vacuum and/or at a pressure below atmosphere during the process. The vacuum level of the transfer chamber 206 may be adjusted to match the vacuum level of corresponding processing chambers. For example, when transferring a substrate from a transfer chamber 206 into the HVPE chamber 202 (or vice versa), the transfer chamber 206 and the HVPE chamber 202 may be maintained at the same vacuum level. Then, when transferring a substrate from the transfer chamber 206 to the load lock chamber 208 or batch load lock chamber 209 (or vice versa), the transfer chamber vacuum level may match the vacuum level of the loadlock chamber 208 or batch load lock chamber 209 even through the vacuum level of the loadlock chamber 208 or batch load lock chamber 209 and the HVPE chamber 202 may be different. Thus, the vacuum level of the transfer chamber may be adjusted. In certain embodiments it may be desirable to backfill the transfer chamber 206 with an inert gas such as nitrogen. In one embodiment, the substrate is transferred in an environment having greater than 90% $N_2$. In certain embodiments, the substrate is transferred in a high purity $NH_3$ environment. In one embodiment, the substrate is transferred in an environment having greater than 90% $NH_3$. In certain embodiments, the substrate is transferred in a high purity $H_2$ environment. In one embodiment, the substrate is transferred in an environment having greater than 90% $H_2$.

In the processing system 200, the robot assembly transfers a carrier plate 211 under vacuum loaded with substrates into the HVPE chamber 202 to undergo a first deposition process. The robot assembly transfers the carrier plate 211 under vacuum into the first MOCVD chamber 203a to undergo a second deposition process. The robot assembly transfers the carrier plate 211 under vacuum into the second MOCVD chamber 203b to undergo a third deposition process. After all or some of the deposition steps have been completed, the carrier plate 211 is transferred from either the HVPE chamber 202 or one of the MOCVD chambers 203a, 203b back to the loadlock chamber 208. In one embodiment, the carrier plate 211 is then released toward the load station 210. In another embodiment, the carrier plate 211 may be stored in either the loadlock chamber 208 or the batch load lock chamber 209 prior to further processing in the HVPE chamber 202 or MOCVD chambers 203a, 203b. One exemplary system is described in commonly assigned U.S. patent application Ser. No. 12/023,572, filed Jan. 31, 2008, titled PROCESSING SYSTEM FOR FABRICATING COMPOUND NITRIDE SEMICONDUCTOR DEVICES, now published as US 2009-0194026, which is hereby incorporated by reference in its entirety.

A system controller 260 controls activities and operating parameters of the processing system 200. The system controller 260 includes a computer processor and a computer-readable memory coupled to the processor. The processor executes system control software, such as a computer program stored in memory. Aspects of the processing system and methods of use are further described in U.S. patent application Ser. No. 11/404,516, filed Apr. 14, 2006, now published as US 2007-024,516, titled EPITAXIAL GROWTH OF COMPOUND NITRIDE STRUCTURES, which is hereby incorporated by reference in its entirety.

Figure 3:
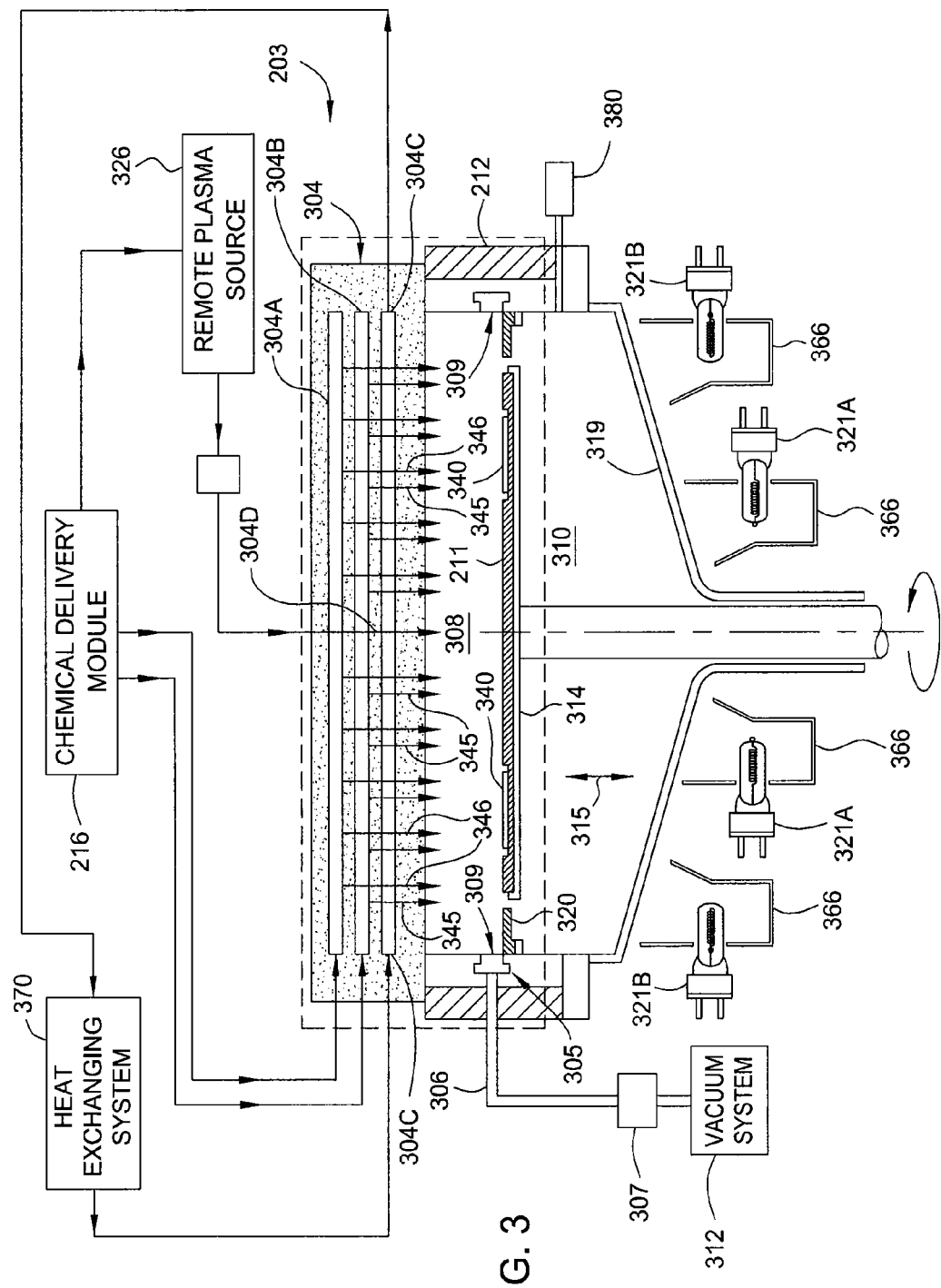
FIG. 3 is a schematic cross-sectional view of one embodiment of a metal-organic chemical vapor deposition (MOCVD) chamber for fabricating compound nitride semiconductor devices according to embodiments described herein.

FIG. 3 is a schematic cross-sectional view of an MOCVD chamber 203 (also referred to herein as 203a and 203b) according to embodiments described herein. The MOCVD chamber 203 comprises a chamber body 212, a chemical delivery module 216 for delivering precursor gases, carrier gases, cleaning gases, and/or purge gases, a remote plasma system 326 with a plasma source, a susceptor or substrate support 314, and a vacuum system 312. The chamber 203 includes a chamber body 212 that encloses a processing volume 308. A showerhead assembly 304 is disposed at one end of the processing volume 308, and the carrier plate 211 is disposed at the other end of the processing volume 308. The carrier plate 211 may be disposed on the substrate support 314. The substrate support 314 has z-lift capability for moving in a vertical direction, as shown by arrow 315. In certain embodiments, the substrate support 314 comprises a heating element, for example, a resistive heating element (not shown) for controlling the temperature of the substrate support 314 and consequently controlling the temperature of the carrier plate 211 and substrates 340 positioned on the substrate support 314.

In one embodiment, the showerhead assembly 304 has a first processing gas channel 304A coupled with the chemical delivery module 216 for delivering a first precursor or first process gas mixture to the processing volume 308, a second processing gas channel 304B coupled with the chemical delivery module 216 for delivering a second precursor or second process gas mixture to the processing volume 308 and a temperature control channel 304C coupled with a heat exchanging system 370 for flowing a heat exchanging fluid to the showerhead assembly 304 to help regulate the temperature of the showerhead assembly 304. In one embodiment, during processing the first precursor or first process gas mixture may be delivered to the processing volume 308 via gas conduits 346 coupled with the first processing gas channel 304A in the showerhead assembly 304 and the second precursor or second process gas mixture may be delivered to the processing volume 308 via gas conduits 345 coupled with the second processing gas channel 304B. In embodiments where the remote plasma source is used, the plasma may be delivered to the processing volume 308 via conduit 304D. It should be noted that the process gas mixtures or precursors may comprise one or more precursor gases or process gases as well as carrier gases and dopant gases which may be mixed with the precursor gases.

Exemplary showerheads that may be adapted to practice embodiments described herein are described in commonly assigned U.S. patent application Ser. No. 11/873,132, filed Oct. 16, 2007, entitled MULTI-GAS STRAIGHT CHANNEL SHOWERHEAD, now published as US 2009-0098276, commonly assigned U.S. patent application Ser. No. 11/873,141, filed Oct. 16, 2007, entitled MULTI-GAS SPIRAL CHANNEL SHOWERHEAD, now published as US 2009-0095222, and commonly assigned U.S. patent application Ser. No. 11/873,170, filed Oct. 16, 2007, entitled MULTI-GAS CONCENTRIC INJECTION SHOWERHEAD, now published as US 2009-0095221, all of which are incorporated by reference in their entireties.

A lower dome 319 is disposed at one end of a lower volume 310, and the carrier plate 211 is disposed at the other end of the lower volume 310. The carrier plate 211 is shown in process position, but may be moved to a lower position where, for example, the substrates 340 may be loaded or unloaded. An exhaust ring 320 may be disposed around the periphery of the carrier plate 211 to help prevent deposition from occurring in the lower volume 310 and also help direct exhaust gases from the chamber 203 to exhaust ports 309. The lower dome 319 may be made of transparent material, such as high-purity quartz, to allow light to pass through for radiant heating of the substrates 340. The radiant heating may be provided by a plurality of inner lamps 321A and outer lamps 321B disposed below the lower dome 319 and reflectors 366 may be used to help control the chamber 203 exposure to the radiant energy provided by inner and outer lamps 321A, 321B. Additional rings of lamps may also be used for finer temperature control of the substrates 340.

In certain embodiments, a purge gas (e.g., a nitrogen containing gas) may be delivered into the chamber 203 from the showerhead assembly 304 and/or from inlet ports or tubes (not shown) disposed below the carrier plate 211 and near the bottom of the chamber body 212. The purge gas enters the lower volume 310 of the chamber 203 and flows upwards past the carrier plate 211 and exhaust ring 320 and into multiple exhaust ports 309 which are disposed around an annular exhaust channel 305. An exhaust conduit 306 connects the annular exhaust channel 305 to a vacuum system 312 which includes a vacuum pump 307. The chamber 203 pressure may be controlled using a valve system which controls the rate at which the exhaust gases are drawn from the annular exhaust channel. Other aspects of the MOCVD chamber 203 are described in commonly assigned U.S. patent application Ser. No. 12/023,520, filed Jan. 31, 2008, and titled CVD APPARATUS, now published as US 2009-0194024, which is herein incorporated by reference in its entirety.

The chemical delivery module 216 supplies chemicals to the MOCVD chamber 203. Reactive gases, carrier gases, purge gases, and cleaning gases are supplied from the chemical delivery system through supply lines and into the chamber 203. In one embodiment, the gases are supplied through supply lines and into a gas mixing box where they are mixed together and delivered to showerhead 304. In another embodiment, the gases are delivered to the showerhead 304 through separate supply lines and mixed within the chamber 203. Generally supply lines for each of the gases include shut-off valves that can be used to automatically or manually shut-off the flow of the gas into its associated line, and mass flow controllers or other types of controllers that measure the flow of gas or liquid through the supply lines. Supply lines for each of the gases may also include concentration monitors for monitoring precursor concentrations and providing real time feedback, backpressure regulators may be included to control precursor gas concentrations, valve switching control may be used for quick and accurate valve switching capability, moisture sensors in the gas lines measure water levels and can provide feedback to the system software which in turn can provide warnings/alerts to operators. The gas lines may also be heated to prevent precursors and cleaning gases from condensing in the supply lines. Depending upon the process used some of the sources may be liquid rather than gas. When liquid sources are used, the chemical delivery module includes a liquid injection system or other appropriate mechanism (e.g. a bubbler) to vaporize the liquid. Vapor from the liquids is then usually mixed with a carrier gas as would be understood by a person of skill in the art.

Remote plasma system 326 can produce plasma for selected applications, such as chamber cleaning or etching residue from a process substrate. In one embodiment, the remote plasma system 326 is a remote microwave plasma system. Plasma species produced in the remote plasma system 326 from precursors supplied via an input line are sent via a conduit for dispersion through the showerhead assembly 304 to the MOCVD chamber 203. Precursor gases for a cleaning application may include chlorine containing gases, fluorine containing gases, iodine containing gases, bromine containing gases, nitrogen containing gases, and/or other reactive elements. Remote plasma system 326 may also be adapted to deposit CVD layers flowing appropriate deposition precursor gases into remote plasma system 326 during a layer deposition process. In one embodiment, the remote plasma system 326 is used to deliver active nitrogen species to the processing volume 308.

The temperature of the walls of the MOCVD chamber 203 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during an in-situ plasma process, or to limit formation of deposition products on the walls of the chamber. The showerhead assembly 304 may also have heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

It should be understood that the MOCVD chamber 203 may be modified to accommodate and process substrates in an in-line conveyor processing system, such as processing system 200, by modifying the chamber to include a conveyor.

In order to improve substrate processing results it is often desirable to monitor the process either during processing or after to determine processing endpoints or to detect any deviations from processing parameter setpoints. In one embodiment, the MOCVD chamber 203 further comprises one or more metrology tools 380 according to one embodiment of the invention for measuring substrate processing parameters, such as temperature and pressure, for example, and various properties of films which are deposited on the substrates, such as thickness, reflectance, real-time film growth rate, composition, stress, roughness, or other film properties. In one embodiment, the metrology tool comprises a reflectance monitor designed for real-time monitoring of film properties. In certain embodiments, the one or more metrology tools and/or one or more sensors 380 may be coupled with the showerhead assembly 304. In certain embodiments, the one or more metrology tools may be disposed along sidewalls of the chamber 203, but the metrology tools 380 may be located anywhere on the chamber 203. Data from the metrology tools and/or sensors 380 can be sent along signal lines to the system controller 260 so that the system controller 260 can monitor the data. In one embodiment, the system controller 260 is adapted to automatically provide control signals to the processing system 200 and the chamber 203 in response to the metrology/sensor data to provide a closed loop control system. Additional description of the metrology tools may be found in PCT/US09/31831, filed Jan. 23, 2009, titled CLOSED LOOP MOCVD DEPOSITION CONTROL, now published as WO2009-099776, which is herein incorporated by reference in its entirety. Although discussed as an in-situ metrology tool it should also be understood that the metrology tool may be located in other positions of the processing system 200. In one embodiment, the metrology tool may be positioned in the transfer chamber 206. In another embodiment, a separate metrology chamber (not shown) may be coupled with the transfer chamber 206.

Figure 4:
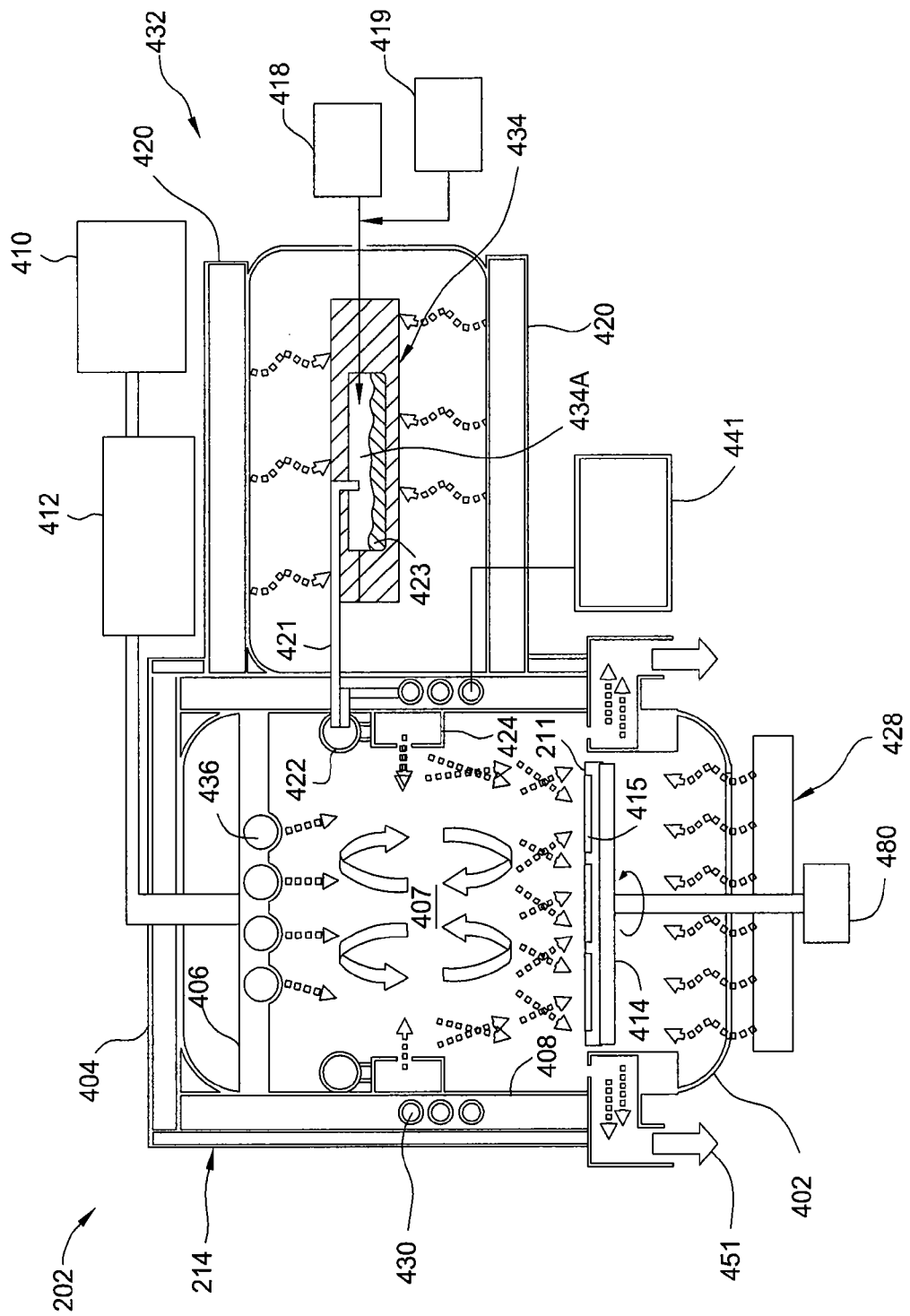
FIG. 4 is a schematic cross-sectional view of one embodiment of a hydride vapor phase epitaxy (HVPE) chamber for fabricating compound nitride semiconductor devices according to embodiments described herein.

FIG. 4 is a schematic cross-sectional view of a hydride vapor phase epitaxy (HVPE) chamber 202 which can be used to practice methods described herein. The HVPE chamber 202 includes a chamber body 214 enclosed by a lid 404. The chamber body 214 and the lid 404 define a processing volume 407. A showerhead assembly 406 is disposed in an upper region of the processing volume 407. A susceptor 414 is disposed opposing the showerhead assembly 406 in the processing volume 407. The susceptor 414 is configured to support a plurality of substrates 415 thereon during processing. In one embodiment, the plurality of substrates 415 are disposed on the carrier plate 211 which is supported by the susceptor 414. The susceptor 414 may be rotated by a motor 480, and may be formed from a variety of materials, including SiC or SiC-coated graphite.

In one embodiment, the HVPE chamber 202 comprises a heating assembly 428 configured to heat the substrates 415 on the susceptor 414. In one embodiment, chamber bottom 402 is formed from quartz and the heating assembly 428 is a lamp assembly disposed under the chamber bottom 402 to heat the substrates 415 through the quartz chamber bottom 402. In one embodiment, the heating assembly 428 comprises an array of lamps that are distributed to provide a uniform temperature distribution across the substrates, substrate carrier, and/or susceptor.

The HVPE chamber 202 further comprises precursor supplying pipes 422, 424 disposed inside the side wall 408 of the chamber 214. The pipes 422 and 424 are in fluid communication with the processing volume 407 and an inlet tube 421 found in a precursor source module 432. The showerhead assembly 406 is in fluid communication with the processing volume 407 and a gas source 410. The processing volume 407 is in fluid communication with an exhaust 451.

The HVPE chamber 202 further comprises a heater 430 embedded within the walls 408 of the chamber body 214. The heater elements 430 embedded in the walls 408 may provide additional heat if needed during the deposition process. A thermocouple may be used to measure the temperature inside the processing chamber. Output from the thermocouple may be fed back to a controller 441 that controls the temperature of the walls of the chamber body 214 by adjusting the power delivered to the heater elements 430 (e.g., resistive heating elements) based upon the reading from a thermocouple (not shown). For example, if the chamber is too cool, the heater 430 will be turned on. If the chamber is too hot, the heater 430 will be turned off. Additionally, the amount of heat provided from the heater 430 may be controlled so that the amount of heat is provided from the heater 430 is minimized. The heater 430 may heat the substrate to a temperature of about 900 degrees Celsius (° C.) to about 1,200 degrees Celsius (° C.). In another embodiment, the heater 430 maintains a metal source within the source boat 434 at a temperature of about 350 degrees Celsius (° C.) to about 900 degrees Celsius (° C.). A thermocouple may be used to measure the metal source temperature during processing. The temperature measured by the thermocouple may be fed back to the controller that adjusts the heat provided from the heater 430 so that the temperature of the metal source may be controlled or adjusted as necessary.

Processing gas from the gas source 410 is delivered to the processing volume 407 through a gas plenum 436 disposed in the gas distribution showerhead assembly 406. In one embodiment, the gas source 410 may comprise a nitrogen containing compound. In one embodiment, the gas source 410 is configured to deliver a gas that comprises ammonia or nitrogen. In one embodiment, an inert gas such as helium or diatomic nitrogen may be introduced as well either through the gas distribution showerhead assembly 406 or through the pipe 424, disposed on the walls 408 of the chamber 214. An energy source 412 may be disposed between the gas source 410 and the gas distribution showerhead assembly 406. In one embodiment, the energy source 412 may comprise a heater or a remote RF plasma source. The energy source 412 may provide energy to the gas delivered from the gas source 410, so that radicals or ions can be formed, so that the nitrogen in the nitrogen containing gas is more reactive.

The source module 432 comprises a halogen gas source 418 connected to a well 434A of a source boat 434 and an inert gas source 419 connected to the well 434A. A source material 423, such as aluminum, gallium or indium is disposed in the well 434A. A heating source 420 surrounds the source boat 434. An inlet tube 421 connects the well 434A to the processing volume 407 via the pipes 422, 424.

In one embodiment, during processing a halogen gas (e.g., $Cl_2$, $Br_2$, or $I_2$) is delivered from the halogen gas source 418 to the well 434A of the source boat 434 to create a metal halide precursor (e.g., GaCl, $GaCl_3$, $AlCl_3$). The interaction of the halogen gas and the solid or liquid source material 423 allows a metal halide precursor to be formed. The source boat 434 may be heated by the heating source 420 to heat the source material 423 and allow the metal halide precursor to be formed. The metal halide precursor is then delivered to the processing volume 407 of the HVPE chamber 202 through an inlet tube 421. In one embodiment, an inert gas (e.g., Ar, $N_2$) is delivered from the inert gas source 419 is used to carry, or push, the metal halide precursor formed in the well 434A through the inlet tube 421 and pipes 422 and 424 to the processing volume 407 of the HVPE chamber 202. A nitrogen-containing precursor gas (e.g., ammonia ($NH_3$), $N_2$) may be introduced into the processing volume 407 through the showerhead assembly 406, while the metal halide precursor is also provided to the processing volume 407, so that a metal nitride layer can be formed on the surface of the substrates 415 disposed in the processing volume 407.

During processing, the processing volume 407 may be maintained at a pressure from about 100 Torr to about 760 Torr. In one embodiment, the processing volume 407 is maintained at a pressure of about 450 Torr to about 760 Torr. Exemplary embodiments of the showerhead assembly 406 and other aspects of the HVPE chamber are described in commonly assigned U.S. patent application Ser. No. 12/637,019, filed Dec. 14, 2009, entitled HVPE CHAMBER HARDWARE, both of which are herein incorporated by reference in their entirety.

It should be understood that the HVPE chamber 202 may be modified to accommodate and process substrates in an in-line conveyor processing system.

Growth of N-Face LED with Integrated Processing System

Figure 6:
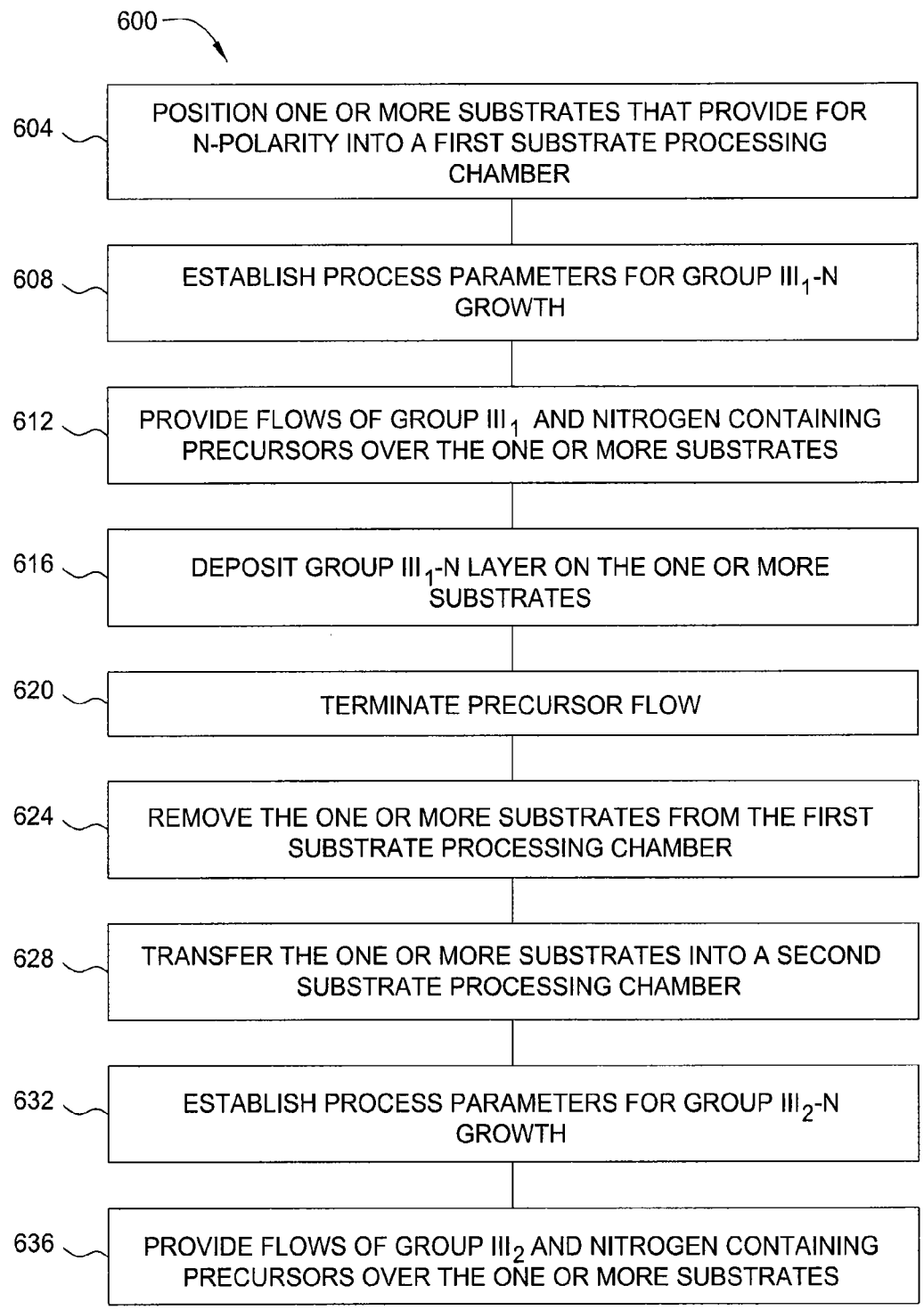
FIG. 6 is a flow diagram of one embodiment of a process that may be used for multiple chamber compound nitride semiconductor formation according to embodiments described herein.
Figure 6:
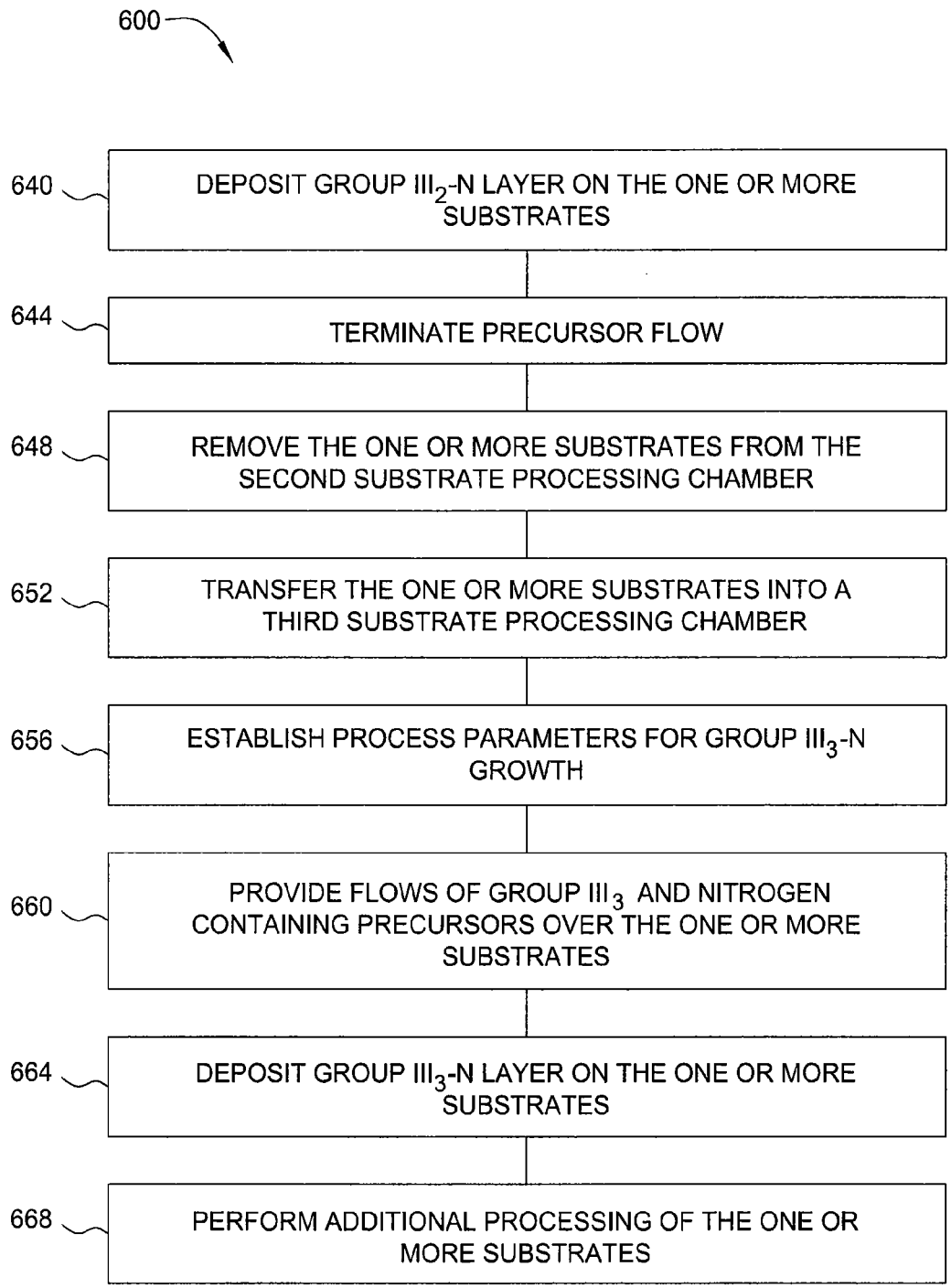

FIG. 6 is a flow diagram of a process 600 that may be used for multiple chamber N-Face compound nitride semiconductor formation according to embodiments described herein. The process begins at block 604 by positioning one or more substrates that provide for N-polarity into a first substrate processing chamber. In one embodiment, the first processing chamber is either chamber 202 or chamber 204. In one embodiment, prior to positioning the substrate into the first processing chamber the one or more substrates may undergo a treatment process in chamber 202 or 204 to configure the substrate for N-face polarity. Treatment techniques that may be used with the embodiments described herein, include, but are not limited to nitridation techniques, and treatment with halogen based etching gas or related compounds, such as fluorine, chlorine, iodine, bromine, hydrochloric acid (HCl) gallium chloride (GaCl), boron trichloride ($BCl_3$), hydrogen bromide (HBr), and combinations thereof. In embodiments, where the processing system is processing system 200, the first substrate processing chamber is an HVPE chamber similar to the HVPE chamber 202. For deposition of an N-Face polarity compound nitride structure, the one or more substrates may comprise a substrate that naturally provides for N-face growth, a substrate that has been exposed to surface treatments to encourage N-face growth, a sapphire substrate, or a SiC substrate. Substrates which naturally provide for N-face growth, include, but are not limited to carbon-faced 6H—SiC substrates and bulk N-face GaN substrates. The one or more substrates may optionally be cleaned prior to the deposition process. Process parameters suitable for growth of a nitride layer may be established at block 608. Such process parameters may include temperature, pressure, and the like to define an environment within the processing chamber appropriate for thermal deposition of a nitride layer. Flows of precursors are provided at block 612 over the one or more substrates to deposit $III_1$-N structures on the one or more substrates at block 616. In one embodiment, the precursors include a nitrogen source and a source for a first group-III element such as Ga. In one embodiment, the nitrogen precursor is $NH_3$. In another embodiment, the nitrogen source may be one or more active nitrogen species derived from remote plasma of a nitrogen-containing material such as nitrogen gas ($N_2$), nitrous oxide ($N_2O$), ammonia ($NH_3$), hydrazine ($N_2H_4$), diimide ($N_2H_2$), hydrazoic acid ($HN_3$), and the like. In one embodiment, the flow rate of the nitrogen source may be between about 3,000 sccm to about 9,000 sccm. A suitable Ga precursor includes, for example, trimethyl gallium ("TMG"). The first group-III element may sometimes comprise a plurality of distinct group-III elements such as Al and Ga, in which case a suitable Al precursor may be trimethyl aluminum ("TMA"). In another example, the plurality of distinct group-III elements includes indium (In) and Ga, in which case a suitable In precursor may be trimethyl indium ("TMI"). In one embodiment, the flow rate of the group-III element may be between about 0.1 sccm to about 50 sccm. A flow of one or more carrier gases selected from the group of argon, nitrogen, hydrogen, helium, neon, xenon, and combinations thereof may also be included.

After deposition of the $III_1$-N structure at block 616, the precursor flows are terminated at block 620. In one embodiment, the one or more substrates are removed from the first substrate processing chamber without exposing the substrate to atmosphere at block 624. Removing the substrate from the processing chamber without braking vacuum prevents exposure of the deposited $III_1$-N structure to oxygen and carbon which act as electrically active dopants/impurities. At block 628, the substrate is transferred under vacuum to a second processing chamber. In certain embodiments, the second processing chamber is chamber 203a.

After the substrate is transferred into the second processing chamber at block 628 subsequent deposition steps are performed in the second processing chamber. At block 632, process parameters suitable for growth of a $III_2$-N layer may be established. Such process parameters may include temperature, pressure, and the like to define an environment within the processing chamber appropriate for thermal deposition of a nitride layer. Flows of precursors are provided at block 636 on the one or more substrates to deposit $III_2$-N structures on the substrate at block 640.

In some embodiments, the $III_2$-N structure includes a group-III element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required and the $III_2$ layer may more generally include such other compositions as quaternary AlInGaN layers. Similarly, in embodiments where the $III_1$-N layer is AlGaN, the $III_2$-N layer may be an InGaN layer on an AlInGaN layer. Suitable precursors for deposition of the $III_2$-N layer may be similar to the precursors used for the $III_1$-N layer, i.e., $NH_3$ is a suitable nitrogen precursor, TMG is a suitable gallium precursor, TMA is a suitable aluminum precursor, and TMI is a suitable indium precursor. A flow of one or more carrier gases selected from the group of argon, nitrogen, hydrogen, helium, neon, xenon, and combinations thereof may also be included.

After deposition of the $III_2$-N structure at block 640, the precursor flows are terminated at block 644. The one or more substrates are removed from the second processing chamber without exposing the one or more substrates to atmosphere at block 648. Removing the one or more substrates from the processing chamber without braking vacuum prevents exposure of the deposited $III_2$-N structure to oxygen and carbon which act as electrically active dopants/impurities. At block 652, the one or more substrates are transferred under vacuum to a third substrate processing chamber. In one embodiment, the third substrate processing chamber is similar to the MOCVD chamber 203b.

After the one or more substrates are transferred into the third processing chamber at block 652 subsequent deposition steps are performed in the third processing chamber. At block 656, process parameters suitable for growth of a $III_3$-N layer may be established. Such process parameters may include temperature, pressure, and the like to define an environment within the processing chamber appropriate for thermal deposition of a nitride layer. Flows of $III_3$ and nitrogen precursors are provided at block 660 on the substrate to deposit $III_3$-N structures on the substrate at block 664. At block 668, additional processing of the substrates may be performed.

The processing conditions used for deposition of the $III_1$-N, the $III_2$-N, and the $III_3$-N layers may vary depending on specific applications. The following table provides exemplary processing conditions and precursor flow rates that are generally suitable in the growth of nitride semiconductor structures using the devices described above:

| Parameter | Value |
| --- | --- |
| Temperature (° C.) | 500-1200 |
| Pressure (Torr) | 5-760 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |
| $Cp_2Mg$ | 0-2,000 |

As will be evident from the preceding description, a process might not use flows of all the precursors in any given process. For example, growth of GaN might use flows of TMG, NH$_3$, and N$_2$ in one embodiment; growth of AlGaN might use flows of TMG, TMA, NH$_3$, and H$_2$ in another embodiment, with the relative flow rates of TMA and TMG selected to provide a desired relative Al:Ga stoichiometry of the deposited layer; and growth of InGaN might use flows of TMG, TMI, NH$_3$, N$_2$, and H$_2$ in still another embodiment, with relative flow rates of TMI and TMG selected to provide a desired relative In:Ga stoichiometry of the deposited layer.

Example

Figure 7:
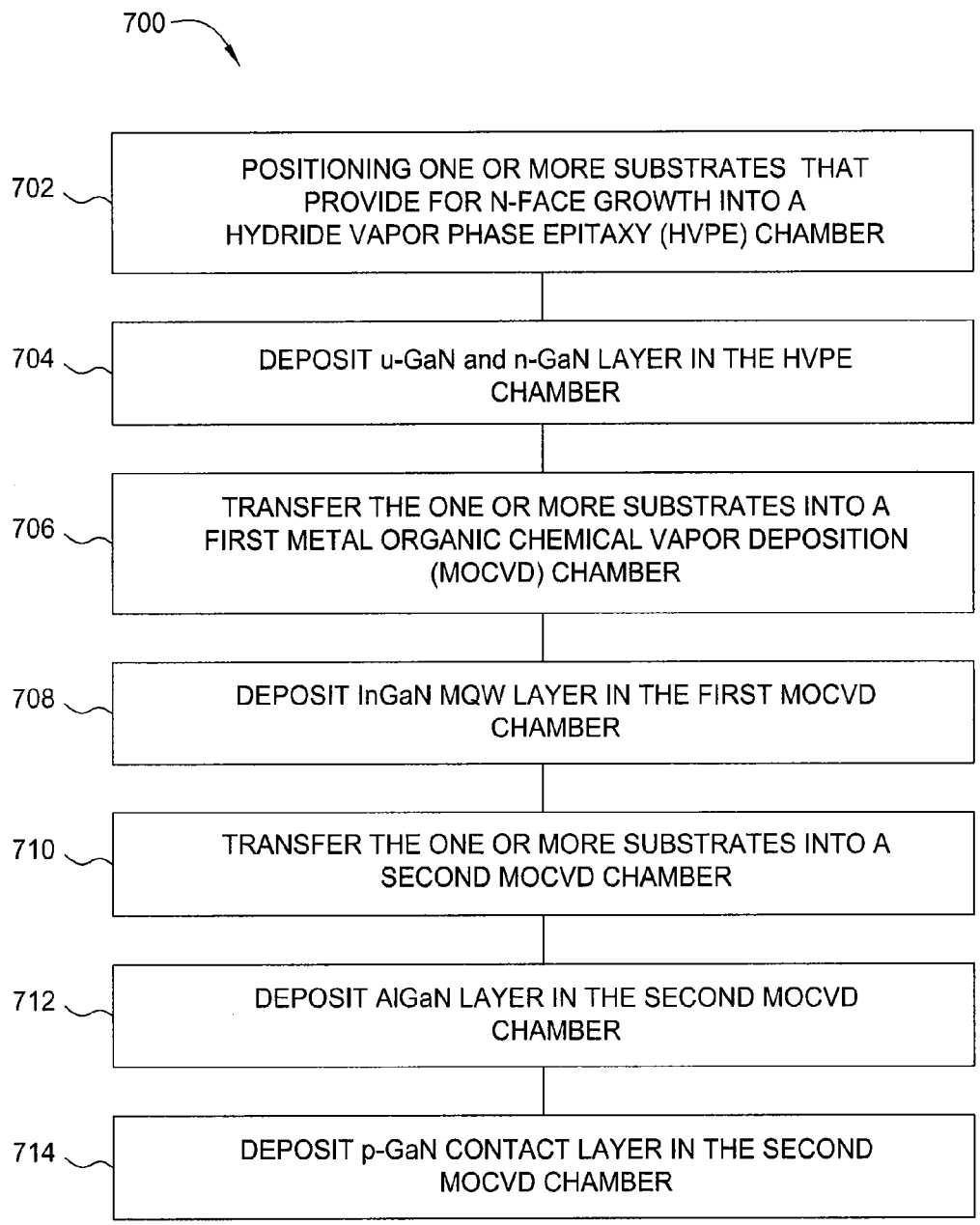
FIG. 7 is a flow diagram of another embodiment of a process that may be used for multiple chamber compound nitride semiconductor formation according to embodiments described herein.

The following example is provided to illustrate how the general process may be used for the fabrication of the N-Face compound nitride structures described in connection with processing system 200. The example refers to an N-Face LED structure, with its fabrication being performed using a processing system 200 having one HVPE chamber 202 and two MOCVD chambers 203a, 203b. In one embodiment, the N-Face LED structure is similar to structure 100. An overview of the process is provided with the flow diagram 700 of FIG. 7. The deposition of the initial III$_1$-N layers (e.g., the GaN layers) is performed in the HVPE chamber 202, deposition of III$_2$-N layers (e.g., the InGaN layer) is performed in the first MOCVD chamber 203a, and deposition of the III$_3$-N layers (e.g. the p-AlGaN, and p-GaN contact layers) is performed in the second MOCVD chamber 203b. In one embodiment, the deposition of the III$_1$-N layers, the III$_2$-N layers, and the III$_3$-N layers are all performed in the HVPE chamber 202.

At block 702 one or more substrates that naturally provide for N-Face polarity are transferred into the HVPE chamber 202. In one embodiment, where the carrier plate 211 containing one or more substrates 340 is transferred into the HVPE chamber 202. The HVPE chamber 202 is configured to provide rapid deposition of GaN.

Optionally, a pretreatment process and/or buffer layer is grown over the substrate in the HVPE chamber 202 using HVPE precursor gases, for example, GaCl$_3$ and NH$_3$ at a temperature of about 550° C. at a chamber pressure of from about 100 Torr to about 600 Torr. In one embodiment, the chamber pressure is about 450 Torr. In one embodiment, for the deposition of a low temperature aluminum nitride (AlN) buffer layer, a higher Group V/Group III ratio (>10,000) is used for the promotion of N-face GaN growth; for comparison, lower Group V/Group III ratio (<5,000-10,000) is used for the growth of Ga-face GaN. In one embodiment, the pressure is between about 100 Torr to about 700 Torr, and the growth temperature is between about 500° C. and about 900° C. In one embodiment, trimethyl aluminum (TMA) precursor is flown at 0-50 sccm and NH$_3$ is flown at 100-100,000 sccm. In one embodiment, the buffer layer is annealed prior to growth of the GaN layer. In one embodiment, the buffer layer is annealed in a H$_2$ containing atmosphere for about 1 min to 100 min after the growth of the low-temperature buffer layer and to growth of the u-GaN/n-GaN layer.

At block 704 a thick u-GaN/n-GaN layer is deposited on the one or more substrates, which in this example is performed using HVPE precursor gases, for example, GaCl$_3$ and NH$_3$ at a temperature of about 1,050° C. and a chamber pressure of about 450 Torr.

In one embodiment, the GaN film is formed over the sapphire substrates by a HVPE process at a temperature between about 700° C. to about 1100° C. by flowing a gallium containing precursor and ammonia. The gallium containing precursor is generated by flowing chlorine gas at a flow rate between about 20 sccm to about 150 sccm over liquid gallium maintained at a temperature between 700° C. to about 950° C.

In one embodiment, the liquid gallium is maintained at a temperature of about 800° C. Ammonia is flown to the processing chamber at a flow rate within the range between about 6 SLM to about 20 SLM. The GaN has a growth rate between about 0.3 microns/hour to about 25 microns/hour, with growth rates up to about 100 microns/hour achievable.

At block 706, after deposition of the u-GaN and n-GaN layer, the carrier plate 211 is transferred out of the HVPE chamber 202 and into the first MOCVD chamber 203a without breaking vacuum, with the transfer taking place in a high-purity N$_2$ atmosphere via the transfer chamber 206. In the first MOCVD chamber 203a, at block 708, the InGaN multi-quantum-well (MQW) active layer is grown using MOCVD precursor gases, for example, TMG, TMI, and NH$_3$ in a H$_2$ carrier gas flow at a temperature from about 750° C. to about 850° C. and a chamber pressure of from about 100 Torr to about 760 Torr. In one embodiment, the chamber pressure is about 300 Torr.

After deposition of the InGaN MQW layer, at block 710 the carrier plate 211 is transferred out of the first MOCVD chamber 203a and into the second MOCVD chamber 203b without breaking vacuum, with the transfer taking place in a high-purity N$_2$ atmosphere via the transfer chamber 206. In the second MOCVD chamber 203b, at block 712, the p-AlGaN layer is grown using MOCVD precursors, such as, TMA, TMG, Cp$_2$Mg, and NH$_3$ provided in a H$_2$ carrier gas flow at a temperature of between about 800° C. and about 1,050° C. and a pressure of between about 50 Torr and about 760 Torr. In one embodiment, the p-AlGaN layer is grown using MOCVD precursors, such as, TMA, TMG, Cp$_2$Mg, and NH$_3$ provided in a H$_2$ carrier gas flow at a temperature of about 1,020° C. and a pressure of about 200 Torr.

At block 714, the p-GaN layer is grown using flows of TMG, NH$_3$, Cp$_2$Mg, and H$_2$ (and/or N$_2$) at a temperature of between about 800° C. and about 1,050° C. and a pressure of between about 50 Torr and about 760 Torr. In one embodiment, the p-GaN layer is grown using flows of TMG, NH$_3$, Cp$_2$Mg, and H$_2$ (and/or N$_2$) at a temperature of about 1,020° C. and a pressure of about 100 Torr. In one embodiment, the p-GaN layer is grown in an ammonia free environment using flows of TMG, Cp$_2$Mg, and N$_2$ at a temperature of between about 850° C. and about 1050° C. During formation of the p-GaN layer, the one or more substrates are heated at a temperature ramp-up rate between about 5° C./second to about 10° C./second.

After the p-AlGaN and p-GaN layers are grown, the completed structure is then transferred out of the second MOCVD chamber 203b. The completed structure may either be transferred to the batch loadlock chamber 209 for storage or may exit the processing system 200 via the loadlock chamber 208 and the load station 210.

In one embodiment, multiple carrier plates 211 may be individually transferred into and out of each substrate processing chamber for deposition processes, each carrier plate 211 may then be stored in the batch loadlock chamber 209 and/or the loadlock chamber 208 while either the subsequent processing chamber is being cleaned or the subsequent processing chamber is currently occupied.

Integrated Growth of GaN Layers with Integrated Processing System

HVPE is a key technique for cost-effective and large scale growth of GaN due to its high growth rate in comparison to other growth techniques while MOCVD is one of the most promising growth techniques for thin layers in device heterostructures or for buffer layers due to its precise control at atomic layer scale. Therefore, HVPE has the advantage of fast growth but lacks the capability of fine control in the atomic scale. The fine control of growth is required during the buffer layer engineering.

Embodiments of the invention relate to the integrated growth of a GaN layer with an integrated processing system, such as a cluster tool or an in-line tool, which includes HVPE and MOCVD chambers. In one embodiment, the growth of the GaN layer is divided into two steps and is carried out in different chambers. In one embodiment, growth of the buffer layer is carried out in a deposition chamber which has low growth rate, such as MOCVD or plasma-assisted MOCVD and growth of the GaN layer is performed in a chamber with a higher growth rate, such as an HVPE chamber. In one embodiment, the buffer layer includes a layer selected from the group comprising GaN, AlN, AlGaN, AlInN, InGaN, AlGaInN, and combinations thereof.

Figure 8B:
FIG. 8B is a schematic illustration of one embodiment of a structure after integrated GaN layer growth according to embodiments described herein.
Figure 8A:
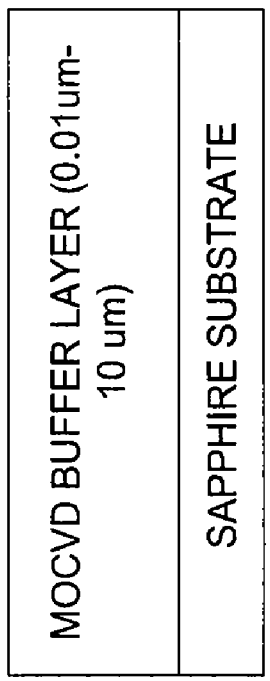
FIG. 8A is a schematic illustration of one embodiment of a structure prior to integrated GaN layer growth according to embodiments described herein.

In one embodiment, the thick GaN layer is grown using HVPE as shown in FIG. 8B, while the buffer layer is grown in another chamber using a lower growth rate process such as MOCVD or plasma-assisted MOCVD, as shown in FIG. 8A. In one embodiment, the one or more substrates are transferred between the chambers under nitrogen or other inert gas ambient without breaking vacuum in between processing steps. In one embodiment, the buffer layer can be a thin nucleation layer, roughed discreet islands, a porous layer (before full coalescence) or a single crystal layer. In one embodiment, the GaN layer can be Ga-polarity (along <0001> direction) or N-polarity (along <0001> direction) as described above.

Figure 9:
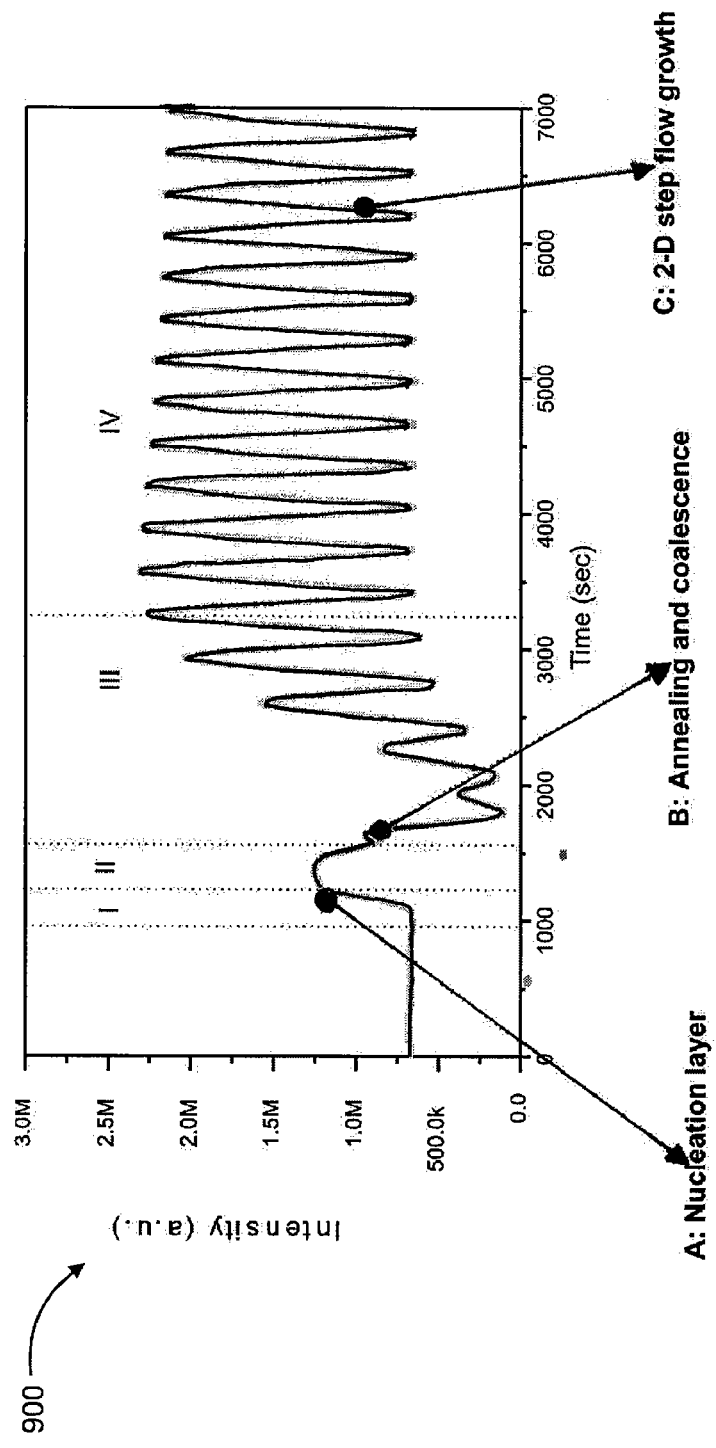
FIG. 9 is a plot of intensity versus time measured during the growth of a buffer layer according to embodiments described herein.

FIG. 9 is a plot 900 of intensity versus time for in-situ reflectance measured for a typical two-step GaN layer deposited in a single MOCVD chamber. As shown in FIG. 9, growth of the GaN layer proceeds through several different stages, including A) nucleation layer, B) annealing and coalescence, and C) two-dimensional step-flow growth. For the integrated GaN growth process with HVPE described herein, the integration point or "transfer point" can be one of the aforementioned three stages mentioned above with reference to FIG. 9. In one embodiment, the thickness of the buffer layer can be in the range of from 0.01 um to 10 um. In one embodiment, the subsequent growth of GaN layer can vary from 1 um to 50 um or more.

The following example is provided to illustrate how the general process may be used for the fabrication of a buffer layer for use in compound nitride structures described in connection with processing system 200. The example refers to the structures described in FIGS. 8A and 8B, with its fabrication being performed using a processing system similar to processing system 200 having at least one MOCVD chamber 203a and at least one HVPE chamber 202. In one embodiment, the LED structure is similar to structure 100 with the buffer layer 108 formed in the MOCVD chamber 203a and the u-GaN+n-GaN layer 112 formed in the HVPE chamber 202. Although described with respect to the processing system 200 it should be understood that the processing systems on which embodiments described herein are performed may have any number or combination of processing chambers as long as at least one MOCVD chamber is coupled with the processing system and at least one HVPE chamber is coupled with the processing system. An overview of the process is provided with the flow diagram 1000 of FIG. 10. Deposition of the buffer layer 108 (e.g., the GaN or AlN layer) is performed in the MOCVD chamber 203a and deposition of the u-GaN+n-GaN layer is performed in the HVPE chamber 202. In one embodiment, subsequent layers such as the Multi-quantum wells (MQW) (e.g., the InGaN MQW layer 116) may be deposited in the second MOCVD chamber 203b, and deposition of the contact layers (e.g. the p-AlGaN 120 and the p-GaN contact layer 124) may be performed in a third MOCVD chamber (not shown).

Figure 10:
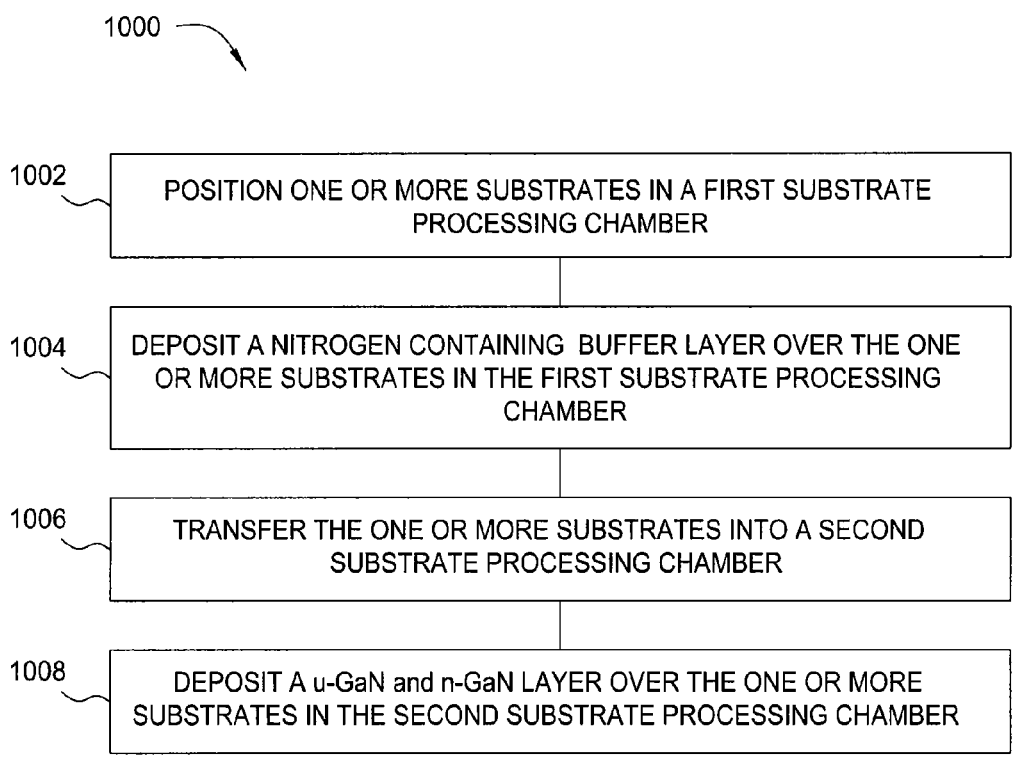
FIG. 10 is a flow diagram of another embodiment of a process that may be used for multiple chamber compound nitride semiconductor formation according to embodiments described herein

With reference to FIG. 10, at block 1002 one or more substrates are positioned into a first substrate processing chamber. In one embodiment, where the first substrate processing chamber is the MOCVD chamber 203a, the carrier plate 211 containing one or more substrates 340 is transferred into the MOCVD chamber 203a. In one embodiment, the MOCVD chamber 203a is configured to provide deposition of a nitride containing buffer layer.

At block 1004, a nitride containing buffer layer, such as buffer layer 108 is grown over the one or more substrates in the MOCVD chamber 203a using MOCVD precursor gases, for example, TMG, $NH_3$, and $N_2$ at a temperature between about 500° C. and about 900° C. In one embodiment, TMG is flown into the MOCVD chamber 203a at a flow rate within the range between about 0 SLM to about 50 SLM. In one embodiment, ammonia is flown into the processing chamber at a flow rate within the range between about 0.1 SLM to about 100 SLM. In one embodiment, nitrogen is flown into the processing chamber at a flow rate within the range between about 0 SLM to about 100 SLM. In one embodiment, the processing chamber is maintained at a temperature of 550° C. and a chamber pressure of from about 100 Torr to about 600 Torr. In one embodiment, the buffer layer is grown on nitridized sapphire wafers with high Group V/Group III ratio and longer annealing time.

In one embodiment, the endpoint for growth of the buffer layer may be determined using in-situ reflectance methods. With reference to FIG. 9, the endpoint of the buffer layer growth may be any of the following different stages, including A) nucleation layer, B) annealing and coalescence, and C) two-dimensional step-flow growth. The desired endpoint may be detected using, for example, metrology tool 370. After detection of the endpoint, the one or more substrates may be removed from the MOCVD chamber 203a and transferred to the HVPE chamber where deposition of the thick u-GaN+n-GaN is performed. In one embodiment, the end point of A is chosen when the buffer layer reaches a certain thickness, for example, 10-30 nm. The ratio of the final reflectance/starting point is proportional to the thickness increase. In one embodiment, the end point of B is chosen based on the roughness of the nucleation layer, or density of the nucleation islands. The decrease of the reflectance indicates the degree of surface roughening. In one embodiment, the end point of C illustrates the stable oscillation of the reflectance, which indicates smooth two-dimensional growth. One benefit of the integrated growth by MOCVD/HVPE is that this stage of nucleation by MOCVD can be precisely controlled and repeated; while HVPE could not give the same level of control in the nucleation layer due to its high growth rates. The integrated growth by MOCVD/HVPE fully utilizes the advantages of both techniques, which is precise control in the critical nucleation layer and low cost in the thicker layer.

At block 1006, the one or more substrates are transferred into a second substrate processing chamber without breaking vacuum. In one embodiment, the transfer takes place in a high-purity nitrogen containing atmosphere via the transfer chamber 206. In one embodiment, the substrate is transferred in an environment having greater than 90% $N_2$. In certain embodiments, the substrate is transferred in a high purity $NH_3$ environment. In one embodiment, the substrate is transferred in an environment having greater than 90% $NH_3$. In certain embodiments, the substrate is transferred in a high purity $H_2$ environment. In one embodiment, the substrate is transferred in an environment having greater than 90% $H_2$.

In one embodiment, where the second substrate processing chamber is an HVPE chamber 202, the carrier plate 211 containing the one or more substrates 340 is transferred into the HVPE chamber 202. The HVPE chamber 202 is configured to provide rapid deposition of a GaN layer.

At block 1008, a u-GaN+n-GaN layer is deposited over the one or more substrates in the second substrate processing chamber. In one embodiment, growth of a thick u-GaN/n-GaN layer, which in this example, is performed using HVPE precursor gases, for example, $GaCl_3$ and $NH_3$ at a temperature of about 1050° C. and a chamber pressure of about 450 Torr.

In one embodiment, the GaN film is formed over a sapphire substrate by a HVPE process performed at a temperature between about 700° C. to about 1100° C. by flowing a gallium containing precursor and ammonia. The gallium containing precursor is generated by flowing chlorine gas at a flow rate between about 20 sccm to about 150 sccm over liquid gallium maintained at a temperature between 700° C. to about 950° C. In one embodiment, the liquid gallium is maintained at a temperature of about 800° C. Ammonia is flown to the processing chamber at a flow rate within the range between about 6 SLM to about 20 SLM. The GaN has a growth rate between about 0.3 microns/hour to about 25 microns/hour, with growth rates up to about 100 microns/hour achievable.

In one embodiment, after deposition of the u-GaN+n-GaN layer, the carrier plate 211 is transferred out of either the HVPE chamber 202 and into the second MOCVD chamber 203b without breaking vacuum, with the transfer taking place in a high-purity atmosphere via the transfer chamber 206. In the second MOCVD chamber 203b the InGaN multi-quantum-well (MQW) active layer is grown using MOCVD precursor gases, for example, TMG, TMI, and $NH_3$ in a $H_2$ carrier gas flow at a temperature of from about 750° C. to about 800° C. and a chamber pressure of from about 100 Torr to about 300 Torr. In one embodiment, the chamber pressure is about 300 Torr.

After deposition of the InGaN MQW layer, the carrier plate 211 is transferred out of the second MOCVD chamber 203b and into a third MOCVD chamber (not shown) without breaking vacuum, with the transfer taking place via the transfer chamber 206. In the third MOCVD chamber, the p-AlGaN layer is grown using MOCVD precursors, such as, TMA, TMG, $Cp_2Mg$, and $NH_3$ provided in a $H_2$ carrier gas flow at a temperature of about 1,020° C. and a pressure of about 200 Torr. The p-GaN layer is grown using flows of TMG, $NH_3$, $Cp_2Mg$, and $H_2$ (and/or $N_2$) at a temperature of 1,020° C. and a pressure of about 100 Torr. In one embodiment, the p-GaN layer is grown in an ammonia free environment using flows of TMG, $Cp_2Mg$, and $N_2$ at a temperature of between about 850° C. and about 1,100° C. In one embodiment, the temperature is between about 850° C. to about 950° C. In another embodiment, the temperature is from about 1,050° C. to about 1,100° C. In one embodiment, during formation of the p-GaN layer, the one or more substrates are heated at a temperature ramp-up rate between about 5° C./second to about 10° C./second.

Optionally, after removal of the carrier plate 211 from each of the HVPE chamber 202, the first MOCVD chamber 203a, the second MOCVD chamber 203b, or the third MOCVD chamber, an in-situ chamber clean process may be performed with cleaning gas. The cleaning gas may include any suitable halogen containing gas. Suitable halogen containing gases include fluorine, chlorine, iodine, bromine, and/or other reactive elements. In one embodiment, the cleaning gas is a chlorine containing cleaning gas. In one embodiment, each processing chamber may be cleaned and seasoned subsequently after removal of a carrier plate and prior to insertion of another carrier plate. In one embodiment, each processing chamber may be cleaned and seasoned periodically. In one embodiment, the frequency and/or duration of each cleaning may be determined based on the thickness of each layer deposited. For example, a cleaning process performed after deposition of a thin layer would be shorter than a cleaning process performed after deposition of a thicker layer. In one embodiment, the first processing chamber may be cleaned after each u-GaN and n-GaN deposition process. In one embodiment, the second MOCVD chamber 203b may be cleaned periodically, for example after fifty deposition cycles. In one embodiment, the third MOCVD chamber may be cleaned after the removal of each carrier plate 211, or periodically, for example after 20-50 deposition cycles.

After the p-AlGaN and p-GaN layers are grown, the completed structure is then transferred out of the third MOCVD chamber. The completed structure may either be transferred to the batch loadlock chamber 209 for storage or may exit the processing system 200 via the loadlock chamber 208 and the load station 210.

In one embodiment, multiple carrier plates 211 may be individually transferred into and out of each substrate processing chamber for deposition processes, each carrier plate 211 may then be stored in the batch loadlock chamber 209 and/or the loadlock chamber 208 while either the subsequent processing chamber is being cleaned or the subsequent processing chamber is currently occupied.

Although certain embodiments were performed on a cluster tool with a 3+1 configuration (e.g. three MOCVD chambers+one HVPE chamber), it should be understood that any number of chambers may be used. For example, a 2+1 configuration (e.g. two MOCVD chambers+one HVPE chamber) may be used with more than one layer deposited in one MOCVD chambers with an optional chamber clean performed between the deposition of each layer. In one aspect of the invention, the substrate processing chambers may include another type of substrate processing chamber, such as a rapid thermal processing (RTP) chamber for substrate annealing, an epitaxial (EPI) deposition chamber, a chemical vapor deposition (CVD) chamber that is adapted to deposit a metal, semiconductor, or dielectric layer, an etch chamber, a sputtering (PVD) chamber, other types of substrate processing chamber, or combinations thereof.

In certain embodiments described herein, the as grown N-face GaN may be rough and it may be desirable to perform additional surface smoothing or polishing steps to smooth the N-face GaN before the growth of InGaN MQW. The in-situ surface smoothing techniques may include at least one of: 1) an in-situ chemical-mechanical polishing process, 2) an in-situ oxidation process with $O_2$ plasma and etching with halogen based etching gas, or, 3) a high temperature annealing performed in $NH_3$, $H_2$, $N_2$, Ar, He, Ne, or halogen based gas atmosphere.

N-face GaN typically has a lower growth rate compared with Ga-face GaN. The difference in growth rated may be related to the different surface thermodynamics related to these two facets. N-face GaN growth may be achieved by MOCVD techniques alone but such techniques suffer from lower growth rates. One advantage of the embodiments described herein involves the use of HVPE to grow N-face GaN at higher growth rates, while using other processes like MOCVD to precisely control the nucleation stage.

While the foregoing is directed to embodiments of the present invention, other and further embodiments of the invention may be devised without departing from the basic scope thereof, and the scope thereof is determined by the claims that follow.

The invention claimed is:

1. A method for fabricating a nitrogen-face (N-face) polarity compound nitride semiconductor device, comprising:
   depositing a nitrogen containing buffer layer having N-face polarity over one or more substrates using a metal organic chemical vapor deposition (MOCVD) process to form one or more substrates having N-face polarity;
   depositing a gallium nitride (GaN) layer over the nitrogen containing buffer layer using a hydride vapor phase epitaxial (HVPE) deposition process, wherein the nitrogen containing buffer layer and the GaN layer are formed without breaking vacuum and exposing the one or more substrates to atmosphere; and
   detecting an endpoint for the depositing a nitrogen containing buffer layer using reflectance methods.

2. The method of claim 1, wherein the nitrogen containing buffer layer is selected from the group consisting of aluminum nitride (AlN), gallium nitride (GaN), AlGaN, AlInN, InGaN, AlGaIn, and combinations thereof.

3. The method of claim 1, wherein the endpoint is selected from the following different growth stages: nucleation, annealing and coalescence, and two-dimensional step-flow growth.

4. The method of claim 1, wherein the nitrogen containing buffer layer has a thickness between 0.01 μm and 10 μm and the GaN layer has a thickness between 1 μm and 50 μm.

5. The method of claim 1, wherein the MOCVD process comprises exposing the one or more substrates having N-face polarity to trimethyl-gallium (TMG) and $NH_3$ at a temperature between about 500° C. and about 900° C. to deposit the nitrogen containing buffer layer.

6. The method of claim 5, wherein the HVPE process comprises exposing the one or more substrates having a nitrogen containing buffer layer disposed thereon to gallium trichloride ($GaCl_3$) and ammonia at a temperature between about 700° C. and about 1,100° C. to deposit the gallium nitride (GaN) layer over the nitrogen containing buffer layer.

7. A method for fabricating a nitrogen-face (N-face) polarity compound nitride semiconductor device, comprising:
   positioning one or more substrates that provide for N-Face growth into a hydride vapor phase epitaxy (HVPE) chamber;
   depositing a first layer comprising nitrogen and a first group-III element over the one or more substrates that provide for N-face growth;
   transferring the one or more substrates into a first metal organic chemical vapor deposition (MOCVD) chamber without breaking vacuum;
   depositing a second layer comprising nitrogen and a second group-III element different from the first group-III element over the first layer;
   transferring the one or more substrates into a second MOCVD chamber without breaking vacuum; and
   depositing a third layer comprising nitrogen and a third group-III element different from the first group-III element and the second group-III element over the second layer in the second MOCVD chamber.

8. The method of claim 7, further comprising:
   depositing a fourth layer comprising nitrogen and a fourth group-III element over the third layer in the second MOCVD chamber.

9. The method of claim 7, wherein the one or more substrates that provide for N-Face growth are selected from 6H—SiC phase silicon carbide and bulk N-Face gallium nitride substrates.

10. The method of claim 7, further comprising:
    depositing a nitrogen containing buffer layer having N-polarity over one or more substrates using a metal organic chemical vapor deposition (MOCVD) process to form the one or more substrates that provide for N-Face growth.

11. The method of claim 10, wherein the nitrogen containing buffer layer is selected from the group consisting of aluminum nitride (AlN), gallium nitride (GaN), AlGaN, AlInN, InGaN, AlGaIn, and combinations thereof.

12. The method of claim 10, further comprising:
    detecting an endpoint for the depositing a nitrogen containing buffer layer using reflectance methods.

13. The method of claim 12, wherein the endpoint is selected from the following different growth stages: nucleation, annealing and coalescence, and two-dimensional step-flow growth.

14. The method of claim 7, further comprising:
    exposing one or more substrates to at least one of a nitridation process, hydrochloric acid (HCl), and gallium chloride (GaCl) to form the one or more substrates that provide for N-Face growth.

15. The method of claim 7, wherein:
    the first group III element is gallium;
    the second group III element is indium;
    the third group III element is aluminum;
    the first layer comprises a GaN layer;
    the second layer comprises an InGaN layer; and
    the third layer comprises AlGaN.

16. The method of claim 7, wherein:
    the first group III element is gallium;
    the second group III element is aluminum;
    the third group III element is indium;
    the first layer comprises a GaN layer;
    the second layer comprises an AlGaN layer; and
    the third layer comprises an InGaN layer.

* * * * *